United States Patent [19]

Roscoe

[11] Patent Number: 4,583,119

[45] Date of Patent: Apr. 15, 1986

[54] SIGNAL INTERFACE CIRCUIT

[75] Inventor: John A. Roscoe, Huntingdon, England

[73] Assignee: U.S. Philips Corporation, New York, N.Y.

[21] Appl. No.: 587,782

[22] Filed: Mar. 9, 1984

[30] Foreign Application Priority Data

Mar. 18, 1983 [GB] United Kingdom ............... 8307589

[51] Int. Cl.[4] .................... H04N 5/04; H04N 5/06
[52] U.S. Cl. ................................ 358/148; 358/150; 328/127; 328/139
[58] Field of Search ............... 358/93, 140, 139, 148, 358/150, 153, 154; 328/139, 127, 140, 157, 262

[56] References Cited

U.S. PATENT DOCUMENTS 4,453,183  6/1984  Balaban et al. .................... 358/148

FOREIGN PATENT DOCUMENTS 57-4619  11/1982  Japan .

OTHER PUBLICATIONS

"Autocorrecting Driver Rights Pulse Polarity", by Shlomo Talmor, Electronics, Jan. 17, 1980, p. 125.

Primary Examiner—Tommy P. Chin
Assistant Examiner—Michael D. Parker
Attorney, Agent, or Firm—Thomas A. Briody; William J. Streeter; Edward W. Goodman

[57] ABSTRACT

A synchronizing signal interface circuit for a television monitor comprises two exclusive-NOR gates G1 and G2 which function as controllable inverters. Line and field sync. signals applied at respective input terminals T1 and T2 are fed to signal inputs SGN1 and SGN2 of the gates G1 and G2, and integrated versions of these signals are produced by respective integrators (Rb,Rc,C) and fed to control inputs INV1 and INV2. Each of the line and field sync. signals has a duty cycle which results in the logic level (0 or 1) of the sync. pulses of the signal being opposite to the logic level (1 or 0) of the integrated version. Due to the exclusive-NOR function of the gates G1 and G2, the logic level or polarity of the output sync. signal pulses will always be the same (negative), for both negative and positive polarity of the input sync. signal pulses. A gate G3 combines the output sync. signal pulses to produce a composite sync. signal.

6 Claims, 3 Drawing Figures

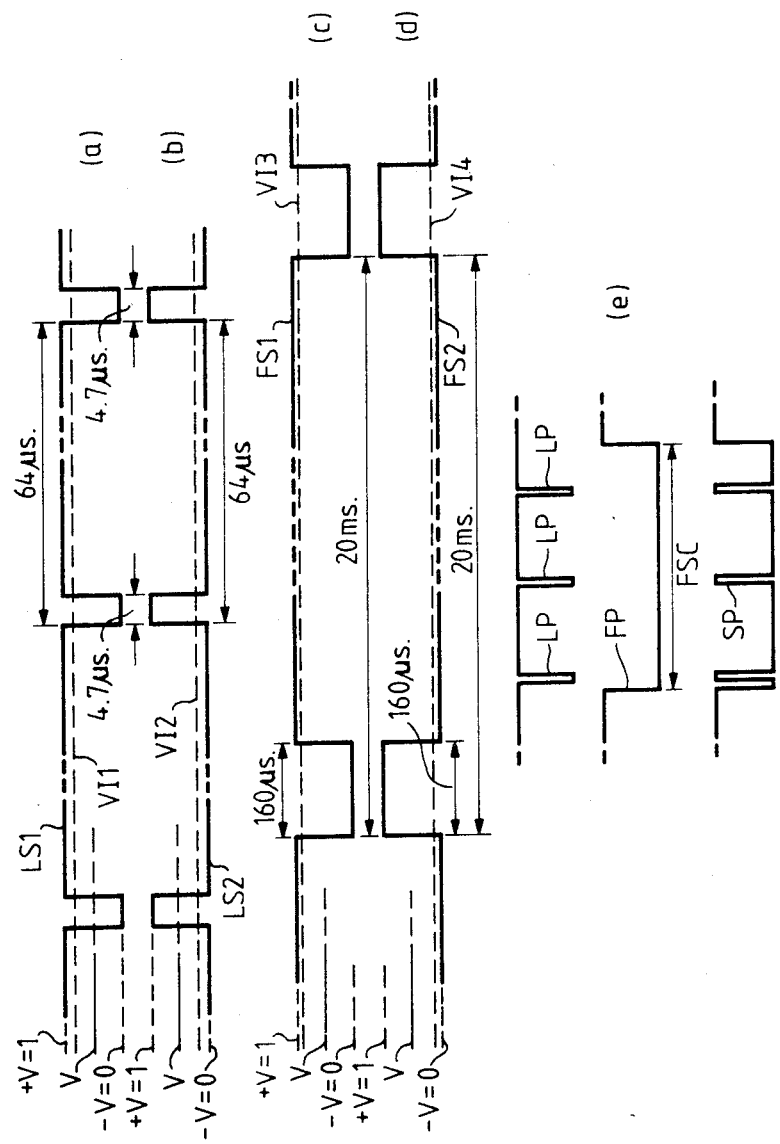

SIGNAL INTERFACE CIRCUIT

BACKGROUND OF THE INVENTION

This invention relates to signal interface circuits and more particularly to a signal interface circuit for receiving synchronizing signals for a television monitor.

Electronic devices such as video games and home computers which are interfaced with a separate television monitor for visual display purposes, can be arranged to generate line and field synchronizing signals for the television monitor separately from video or RGB signals.

However, some forms of these electronic devices may provide synchronizing signals comprising positive going pulses, while others may provide synchronizing signals comprising negative going pulses. In order to cater for these possible alternative pulses, it is known for a separate television monitor to incorporate manual switching means for selecting the particular synchronizing pulse sense or polarity that the television monitor is to respond to, as determined by an electronic device with which it is interfaced.

SUMMARY OF THE INVENTION

It is an object of the present invention to provide for a television monitor a synchronizing signal interface circuit which obviates the need to make such a manual selection of the synchronizing pulse sense or polarity.

According to the invention a synchronizing signal interface circuit for a television monitor comprises a controllable inverter having a signal input connected to receive a synchronizing signal comprising pulses having one of two possible logic levels, the signal assuming the other logic level between successive pulses, the inverter also having an output from which a restituted synchronizing signal is produced and a control input connected to receive an integrated version of said synchronizing signal, the interface circuit including an integrator which is connected to receive said synchronizing signal and is operable to produce said integrated version thereof, the time constant of the integrator in relation to the duty cycle of said synchronizing signal between the two logic levels being such that whichever one of the two logic levels the synchronizing pulses have, the integrated version of the synchronizing signal has the other logic level, the inverter effecting inversion of the signal at its input in response to one logic level of the integrated version at the control input, but not in response to the other logic level.

Thus, a synchronizing signal interface circuit according to the invention wil produce at the inverter output a restituted synchronizing signal which will have pulses of the same logic level for either logic level of the pulses of the synchronizing signal applied to its signal input.

In carrying out the invention the controllable inverter is suitably an exclusive-NOR gate, the signal interface circuit being operable to provide a synchronizing signal having pulses of negative sense or polarity in response to a synchronizing signal having pulses of either positive or negative sense or polarity.

A synchronizing signal interface circuit according to the invention will be operable in response to a synchronizing signal which is either a line or a field television synchronizing signal, or which is a composite signal containing both the line and field television synchronizing signals.

Where interfacing is to be in respect of line and field television synchronizing signals which are supplied separately by a electronic device, a synchronizing signal interface circuit according to the present invention can comprise two controllable inverters and associated integrators which are both organized and operable as specified and are connected to receive a respective one of said line and field television synchronizing signals, together with a combining gate to respective inputs of which the restituted signals from the two inverters are applied, this combining gate providing at its output a restituted composite line and field synchronizing signal.

Conveniently, the combining gate is a further exclusive-NOR gate.

DESCRIPTION OF THE DRAWINGS

In order that the invention may be more fully understood reference will now be made by way of example to the accompanying drawings of which:

FIGS. 3(a) to 3(e) show various idealized line and field television synchronizing signals.

DESCRIPTION OF THE PREFERRED EMBODIMENT

Figure 1:
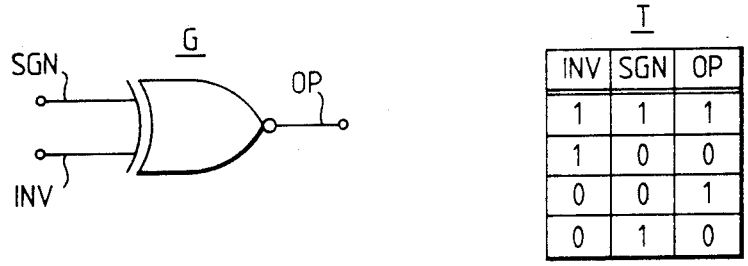
FIG. 1 shows a controllable inverter and related truth table.

Referring to the drawing, the controllable inverter shown in FIG. 1 is comprised by an exclusive-NOR gate G having two inputs INV and SGN, and an output OP. The input SGN serves as a signal input and the input INV serves as a control input. Assuming that a high logic input level equals 1 and a low logic input level equals 0, then the truth table T shows the logic levels at the output OP for the various combinations of logic input levels. It can be seen from the truth table T that when the logic input levels are different, the logic output level is 0, whereas when the logic input levels are the same the logic output level is 1. Thus, the logic level on the control input INV provides an inverting control in that when there is applied to this control input INV a signal having the logic level 1, the output logic level will be the same as the logic level on the signal input SGN, whereas when a signal having the logic level 0 is applied to the control input INV, the output logic level will be the inverse of the logic level on the signal input SGN.

Figure 2:
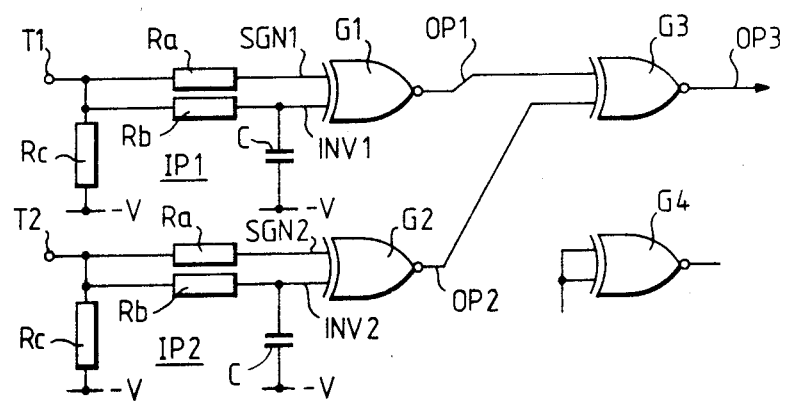
FIG. 2 shows a synchronizing signal interface circuit according to the invention.

The synchronizing signal interface circuit shown in FIG. 2 comprises two exclusive-NOR gates G1 and G2 which serve as respective controllable inverters. These two gates G1 and G2 have respective input circuits IP1 and IP2 each of which comprises three resistors Ra, Rb and Rc and a capacitor C. The elements Rb, Rc and C in each input circuit form respective integrators.

A signal applied to input terminal T1 is fed to the signal input SGN1 of the gate G1 via the resistor Ra. Also, an integrated version of this signal is fed to the control input INV1 by the integrator (Rb, Rc, C) of the input circuit IP1. Assume that the signal applied to the input terminal T1 is a television line synchronizing signal LS1 as shown in FIG. 3(a). This signal LS1 is a negative going signal in the sense that the 4.7 μs. pulse thereof occurs at a potential −V which can be considered as a logic level 0. The remainder of the signal LS1 within the 64 μs line period is held at a potential +V which can be considered as a logic level 1. The duty cycle of the signal LS1 is therefore 4.7/64×100=7.34%, with respect to the logic level 0(−V). By arranging that a logic level 1 prevails or that a logic level 0 prevails, depending on whether a signal level is above or below a threshold level V which is midway between the maximum positive and negative potentials +V and −V, the integrated version of the signal LS1 can have a logic level 1 by attaining a potential value VI1 by a suitable choice of the integration time constant relative to the duty cycle of the signal LS1. As a result, the restituted signal at the output OP1 of the gate G1 will be a negative going signal like the line synchronizing signal LS1.

If the signal applied to the terminal T1 is a positive going line synchronizing signal LS2 as shown in FIG. 3(b), then since the duty cyle of this signal LS2 is 59.3/64×100=92.66% with respect to the logic level 0 (−V), the integrated version of this signal LS2 attains a potential value VI2 which is a logic 0 level. As a result, the restituted signal at the output OP1 of the gate G1 will again be a negative going signal, even though the line synchronizing signal LS2 is a positive going signal.

Similar results will be obtained for the negative going and positive going television field synchronizing signals FS1 and FS2 shown in FIGS. 3(c) and 3(d). The signal FS1 has a 160 μs pulse (i.e. 2.5 line periods of 64 μs.) in each field period of 20 ms., so that its duty cycle with respect to the logic level 0 (−V) is $(160 \times 10^{-6}/20 \times 10^{-3}) \times 100 = 0.8\%$. The duty cycle of the signal FS2 is therefore 99.2%. In this instance, the integrated versions VI3 and VI4 of the signals FS1 and FS2 will be virtually at the maximum potentials +V and −V, respectively. Therefore, both the signals FS1 and FS2 will also result in restituted field synchronizing signals of negative polarity at the output OP1.

The gate G2 and associated input circuit IP2 will function in the same manner in response to the signals LS1, LS2, FS1 and FS2 applied at terminal T2.

The two outputs OP1 and OP2 of the gates G1 and G2 are connected to respective inputs of a third exclusive-NOR gate G3 the output OP3 of which serves as the output for the overall synchronizing signal interface circuit. The gate G3 functions as a combining or "mixer" gate.

When either one of the negative going and positive going line synchronizing signals LS1 and LS2 is applied to one of the two input terminals T1 and T2 and either one of the negative and positive field synchronizing signals FS1 and FS2 is applied to the other of these two input terminals T1 and T2, it can be seen that there will be produced at the output OP3 a negative going composite line and field synchronizing signal. Also, a negative going composite line and field synchronizing signal will be produced at the output OP3 when a composite line and field synchronizing signal is applied to either terminal T1 or terminal T2. FIG. 3(e) illustrates the presence of positive spikes SP in the field pulse period FSC of the composite signal due to the occurrence of line pulses LP within the field pulse FP.

It is to be understood that the logic level potentials +V and −V are to be construed in a relative rather than an absolute sense. For instance, the potential −V may be ground potential, with the potential +V having absolute positive value, or both the potentials +V and −V can have different positive or negative absolute values.

In one specific implementation of the synchronizing signal interface circuit shown in FIG. 2, Philips integrated circuit type HEF4077B (Quadruple Exclusive-NOR gate) can be used for the gates G1 to G3. Gate G4 (unconnected) represents the fourth gate of the integrated circuit. Also, for a 625-line television standard, for which the line synchronizing pulses are 4.7 μs. within a 64 μs. line period and the field synchronizing pulses are 160 μs pulses within a 20 ms field period, the values of the components in the input circuits IP1 and IP2 are Ra, Rb, Rc=100k ohms, C=100 nF. The supply voltage to the integrated circuit should be chosen to be the same as the height of the input signal waveform(s), down to 3 volts minimum.

Alternatively, a simple limiting amplifier can be used at each input to ensure that the logic level requirements of the integrated circuit are met.

I claim:

1. A signal interface circuit for receiving synchronizing signals for a television monitor, characterized in that said signal interface circuit comprises a controllable inverter having a signal input connected to receive a synchronizing signal comprising pulses having one of two possible logic levels, the signal having a duty cycle and assuming the other logic level between successive pulses, the inverter also having a output from which a restituted synchronizing signal is produced and a control input connected to receive an integrated version of said synchronizing signal, the interface circuit including an integrator having a time constant and which is connected to receive said synchronizing signal and is operable to produce said integrated version thereof, the time constant of the integrator in relation to the duty cycle of said synchronizing signal between the two logic levels being such that whichever one of the two logic levels the synchronizing pulses have, the integrated version of the synchronizing signal has the other logic level, the inverter effecting inversion of the signal at its input in response to one logic level of the integrated version at the control input, but not in response to the other logic level.

2. A signal interface circuit as claimed in claim 1, characterized in that the controllable inverter is an exclusive NOR-gate, the signal interface circuit being operable to provide said restituted synchronizing signal having pulses of negative sense or polarity in response to a synchronizing signal having pulses of either positive or negative sense or polarity.

3. A signal interface circuit as claimed in claim 1, for interfacing in respect of line and field television synchronizing signals which are to be received separately, characterized in that said signal interface circuit comprises a further controllable inverter and a further integrator which are organized and operable as said inverter and integrator, said integrator and inverter and said further integrator said said further inverter being connected to receive, respectively, said line and field television synchronizing signals, said signal interface circuit further comprising a combining gate having respective inputs to which restituted line and field synchronizing signals from the inverter and the further inverter, respectively, are applied, this combining gate providing at its output a restituted composite line and field synchronizing signal.

4. A signal interface circuit as claimed in claim 3, characterized in that said combining gate is an exclusive-NOR gate.

5. A signal interface circuit as claimed in claim 2, for interfacing in respect of line and field television synchronizing signals which are to be received separately, characterized in that said signal interface circuit comprises a further controllable inverter and a further integrator which are organized and operable as said inverter and integrator, said inverter and integrator and said further inverter and further integrator being connected to receive, respectively, said line and field television synchronizing signals, said signal interface circuit further comprising a combining gate having respective inputs to which restituted line and field synchronizing signals from the inverter and the further inverter, respectively, are applied, this combining gate providing at its output a restituted composite line and field synchronizing signal.

6. A signal interface circuit as claimed in claim 5, characterized in that said combining gate is an exclusive-NOR gate.

* * * * *